(12) United States Patent
Shimada

(10) Patent No.: US 7,053,004 B2
(45) Date of Patent: May 30, 2006

(54) DECREASING THE RESIDUE OF A SILICON DIOXIDE LAYER AFTER TRENCH ETCHING

(75) Inventor: Koji Shimada, Okayama (JP)

(73) Assignee: Sharp Kabushiki kaisha, Osaka (JP)

( * ) Notice: Subject to any disclaimer, the term of this patent is extended or adjusted under 35 U.S.C. 154(b) by 0 days.

(21) Appl. No.: 10/845,101

(22) Filed: May 14, 2004

(65) Prior Publication Data

US 2005/0255695 A1    Nov. 17, 2005

(51) Int. Cl.
*H01L 21/302*  (2006.01)
*H01L 21/461*  (2006.01)

(52) U.S. Cl. .................. 438/736; 438/694; 438/638
(58) Field of Classification Search ................ 438/736, 438/737, 694, 638, 624
See application file for complete search history.

(56) References Cited

U.S. PATENT DOCUMENTS

| 6,376,572 | B1 * | 4/2002 | Turri .......................... 522/173 |
| 6,391,472 | B1 * | 5/2002 | Lamb et al. ................. 428/624 |
| 6,809,033 | B1 * | 10/2004 | Hui et al. .................... 438/694 |
| 2005/0054194 | A1 * | 3/2005 | Tsai et al. .................... 438/638 |

* cited by examiner

*Primary Examiner*—Caridad Everhart
(74) *Attorney, Agent, or Firm*—Birch, Stewart, Kolasch, & Birch, LLP.

(57) ABSTRACT

A semiconductor device is formed using a BARC (bottom antireflective coating) that minimizes the formation of fences around the via holes. The BARC is formed from an organic antireflective layer over an inorganic antireflective layer. The organic antireflective layer also covers the internal surface of the via hole. Subsequent treatment with dilute aqueous or organic solvent leaves a thinned organic antireflective layer and a plug of organic material at the bottom of the via hole. The resulting semiconductor is free from the via hole fence formation that characterizes the conventional art technology.

7 Claims, 13 Drawing Sheets

FIG. 2(a')
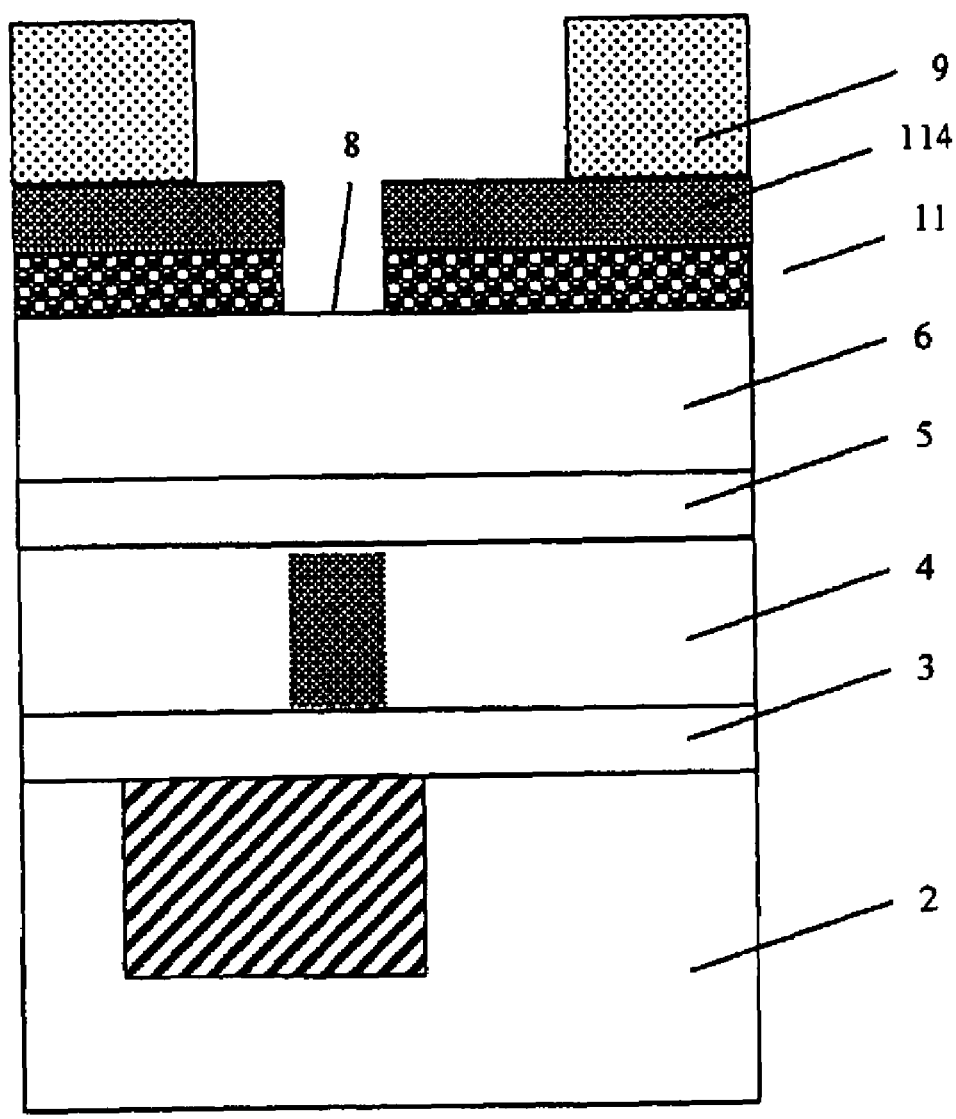

DECREASING THE RESIDUE OF A SILICON DIOXIDE LAYER AFTER TRENCH ETCHING

FIELD OF THE INVENTION

The invention pertains to obtaining an improved dual damascene profile without fencing after trench etching by using solvent.

BACKGROUND OF THE INVENTION

Each succeeding generation of semiconductor integrated circuits increase in speed and their features proliferate. Two factors govern the speed of signal transmission in semiconductor circuits: 1) switching time in the transistor portion, and 2) the time that an electrical signal is propagated in a circuit (wiring delay component). The switching time component tends to decrease with the reduction of transistor size, while the wiring delay component tends to increase with the refinement, i.e., diminution, in size of wiring layers and the increasing complexity of wiring circuitry. Since wiring delay is determined by the product (C×R) of wiring capacity C and wiring resistance R, the use of Cu as a material for wiring has been enthusiastically studied as a means of restricting wiring delay since it has a lower resistance than Al which has traditionally been used.

Damascene refers to a process in which interconnect metal lines are delineated by isolating dielectrics. Damascening is not performed by lithography and etching, but by chemical-mechanical planarization (CMP). In damascening, an interconnect pattern is first lithographically defined in the layer of dielectric, then metal is deposited to fill in the resulting trenches. Then excess metal is removed by means of chemical-mechanical polishing (planarization).

Chemical-mechanical polishing (CMP), also called chemical-mechanical planarization, refers to a method of removing layers of solid by chemical-mechanical polishing carried out for the purpose of surface planarization and definition of the metal interconnect pattern.

Dual damascene is a modified version of the damascene process which is used to form metal interconnect geometry using a CMP process instead of metal etching. In dual damascene, two interlayer dielectric patterning steps and one CMP step create a pattern which would otherwise require two patterning steps and two metal CMP steps when using a conventional damascene process.

FIG. 1(a) through FIG. (d) are drawings explaining a conventional method of manufacturing a semiconductor device having dual damascene structure wiring.

In a first conventional method of manufacturing a semiconductor shown in FIG. 1(a), a first silicon nitride ($Si_3N_4$) film 3, a first silicon oxide film 4, a second silicon nitride ($Si_3N_4$) film 5 and a second silicon oxide film 6 are successively formed over a layer insulation film 2 in which a first wiring layer 1 is embedded. The first wiring layers are formed on a substrate, not depicted in the drawings for the sake of brevity.

Next, as is shown in FIG. 1(b), anisotropic dry etching to open via hole 8 is performed using a first photoresist 7 as a mask. This etching is performed until the first nitride film 3 is exposed in the interior of via hole 8. The via hole 8 is also referred to as a contact hole. The first nitride film 3 acts as a stopper film that stops the progress of etching in this etching process as shown in FIG. 1(b).

When the etching to open via hole 8 is finished, the first photoresist 7 is removed from above the second silicon oxide film 6. Optionally, a second photoresist 9 which has an open portion that corresponds to the wiring slot 10 is formed in its place, as shown in FIG. 1(c).

Next, anisotropic dry etching to open wiring slot 10 is performed using the second photoresist 9 as a mask. This etching is performed under the condition that a silicon oxide film can be removed with a significant selection ratio to the silicon nitride film. At this time, the first silicon nitride film 3 and the second nitride film 5 are both used as stopper films which stop the progress of etching. Next, etching for the purpose of removing the second silicon nitride film 5 exposed in the bottom of wiring slot 10 and the first silicon nitride film 3 exposed in the bottom of via hole 8 is performed. If this processing is done properly, via hole 8 which exposes the surface of first wiring layer 1 and wiring slot 10 which leads to via hole 8 are formed as shown in FIG. 1(d).

In the latest generation (sub 0.25 μm technology and finer) semiconductors, deep UV lithography techniques are used to pattern the fine structure of gates and via holes. An antireflective coating (ARC) is commonly applied between the poly-Si and the photoresist to reduce undesirable reflections.

In a conventional art process, a method of forming a via-hole resist pattern includes applying an organic or inorganic ARC film 11, as is shown in FIG. 2(a) and in FIG. 2(b). The ARC can be an organic polymer such as PMMA (polymethyl methacrylate) or polycarbonate. The ARC can also be an inorganic material such as SiON or $Ta_2O_5$. This simplifies the process, but the antireflective coating film adhering to the side walls of the via hole becomes a mask when etching the layer insulation film around the via hole, and a layer insulation film residue 12 which has a fence configuration around the via hole occurs. FIG. 3 shows the fence around the via hole. Such layer of film residues with a fence configuration cause variations in the resistance value of the wiring layer.

When using this previously noted process, it is difficult to control the depth of antireflective film 11 in the etching back process. When this etching back process is conducted in oxygen plasma, the etching speed becomes very fast due to the etching speed planar distribution being non-uniform. Further, when etching with oxygen plasma in this way, the material that adheres to the walls of the reaction chamber of the dry etching device peels off due to exposure to the oxygen plasma. This detritus becomes particles which adhere to the semiconductor or device substrate, thereby causing contamination problems such as the formation of defects. While problems like these may be at least partially avoided by performing the etch back process in a special dry etching device, the manufacturing process for semiconductors thereby becomes highly complex and thus increases manufacturing costs.

As has been shown, conventional semiconductor processing forms fence structures around the via hole, and disadvantageous resistance variations in the wiring layer results. Further, conventional semiconductor processing causes contamination problems and the associated proliferation of defects.

SUMMARY OF THE INVENTION

The invention, in part, solves the fencing problem associated with the conventional art technology by utilizing an organic/inorganic bilayer BARC (bottom antireflective coating) that is subjected to a solvent treatment of the top organic layer of the BARC.

The invention, in part, pertains to a method for manufacturing a semiconductor device which forms a first stopper film over a layer insulation film in which a wiring layer is embedded, forming a first dielectric film over the first stopper film, forming a second stopper film over the first dielectric film, forming a second dielectric film over the second stopper film, forming a via hole from the second dielectric film to the first stopper film, forming an inorganic BARC over the second dielectric film, forming an organic BARC over the inorganic BARC, the inorganic BARC covering an inside surface of the via hole, and treating the organic BARC with a solvent.

The invention, in part, pertains to solvent treatment with at least one solvent selected from a dilute sulfuric acid solution, a slightly alkaline solution, ethyleneglycol monomethylether acetate, propyleneglycol, monomethylether acetate, cyclohexane, or γ-butyrolactone.

In preferred embodiments of the invention, in part, the organic BARC may comprise PMMA and the inorganic BARC comprises silicon nitride or silicon oxynitride. The wiring layer may comprise at least one of aluminum, copper or aluminum-copper alloy. The first dielectric and the second dielectric may comprise silicon dioxide. The second stopper film may comprise silicon nitride or low-k materials.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention. The drawings illustrate embodiments of the invention and together with the description serve to explain the principles of the embodiments of the invention.

FIG. 2(a') shows that before wiring slot photo, a step of forming a BARC (bottom antireflective coating) is used.

DETAILED DESCRIPTION

Advantages of the present invention will become more apparent from the detailed description given herein after. However, it should be understood that the detailed description and specific examples, while indicating preferred embodiments of the invention, are given by way of illustration only, since various changes and modifications within the spirit and scope of the invention will become apparent to those skilled in the art from this detailed description.

FIG. 4(a) through FIG. 4(d) are drawings explaining a method of manufacturing a semiconductor device according to a preferred embodiment of the invention.

Figure 1A:
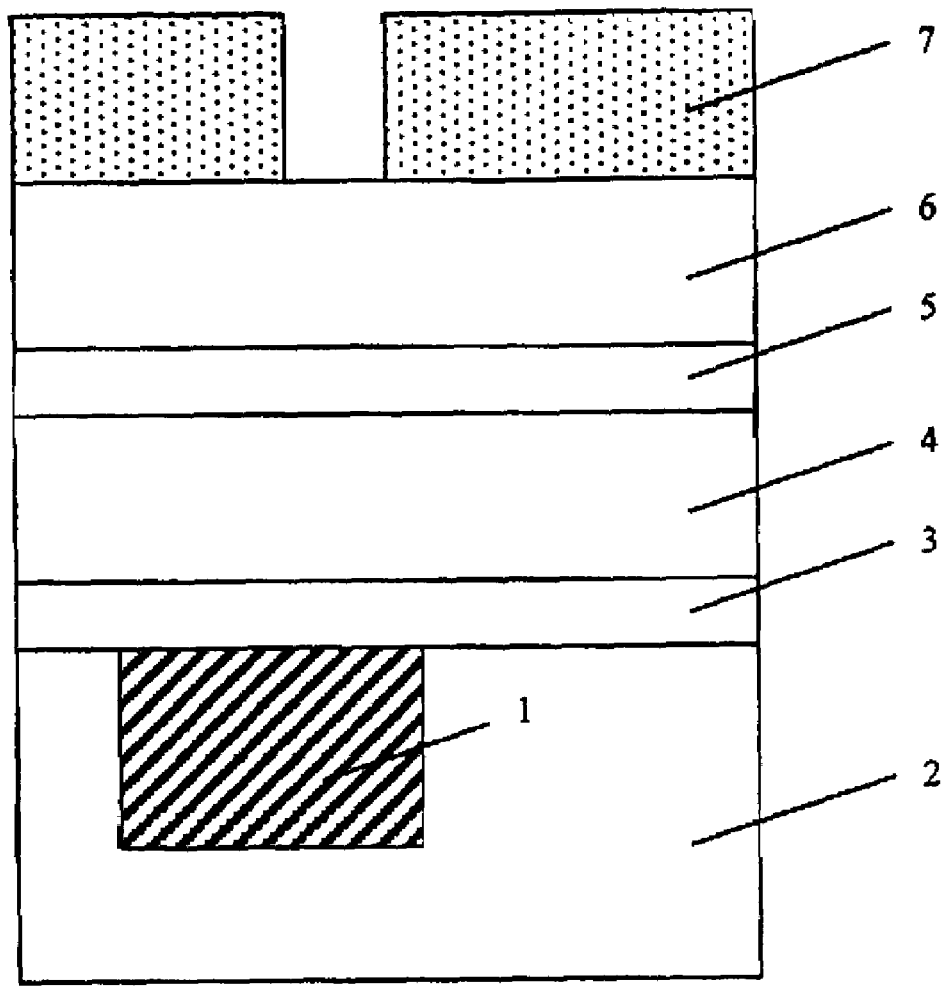
FIG. 1(a) shows a method of manufacturing a semiconductor device according to the conventional art.
Figure 1B:
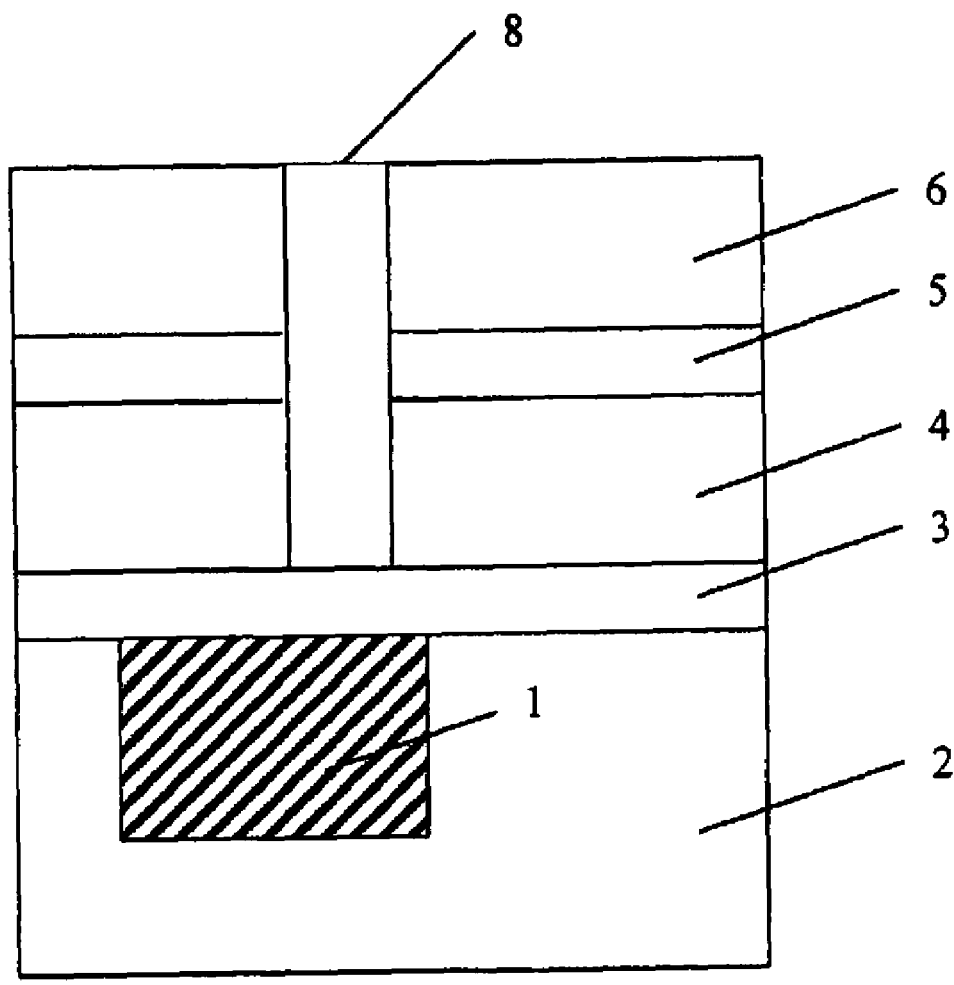
FIG. 1(b) shows the step of forming a via hole in a semiconductor device according to the conventional art.
Figure 1C:
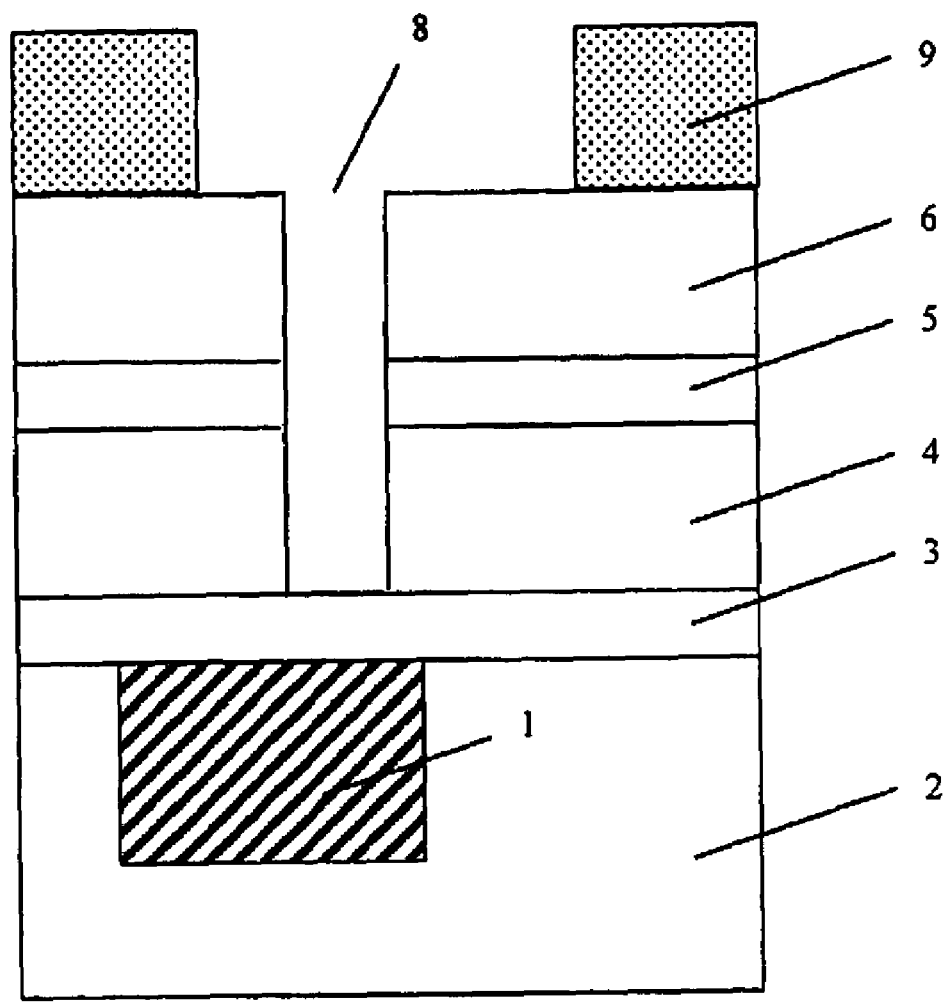
FIG. 1(c) shows the step of forming a wiring slot structure in a semiconductor device according to the conventional art.
Figure 1D:
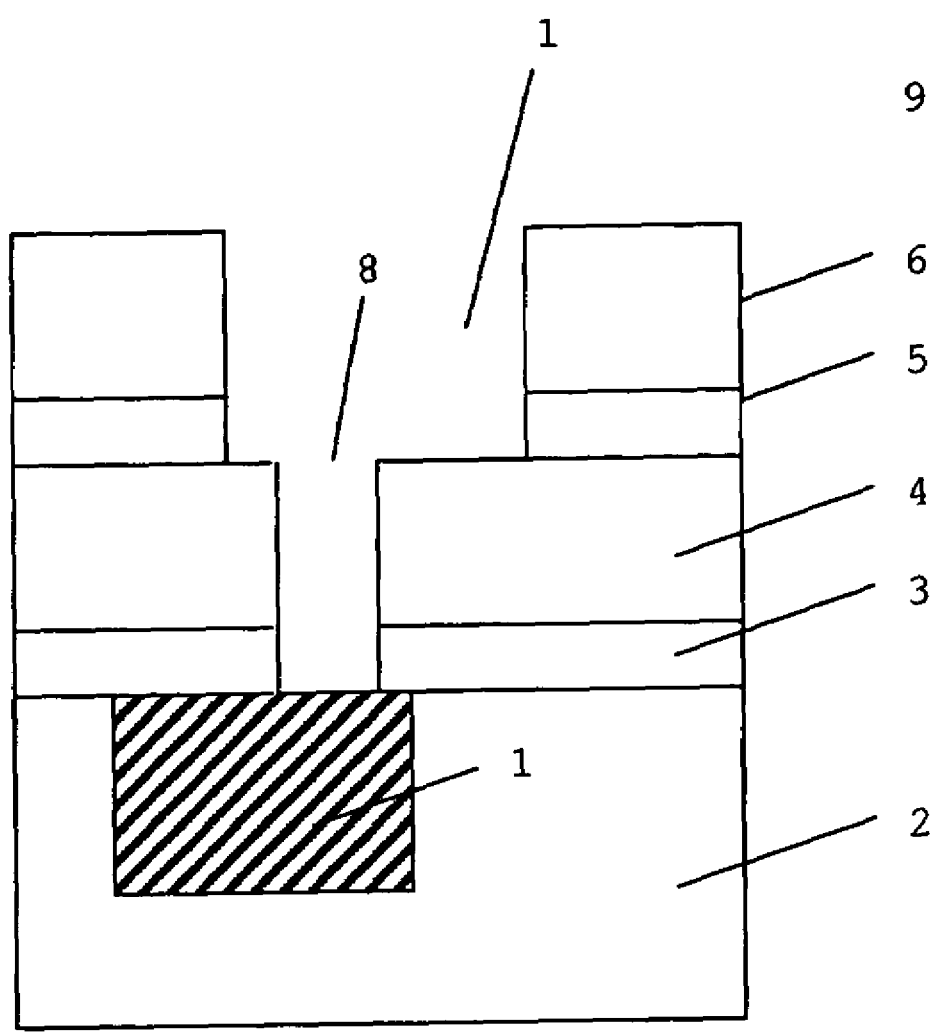
FIG. 1(d) shows the step of etching the wiring slot in a semiconductor device according to the conventional art.
Figure 2A:
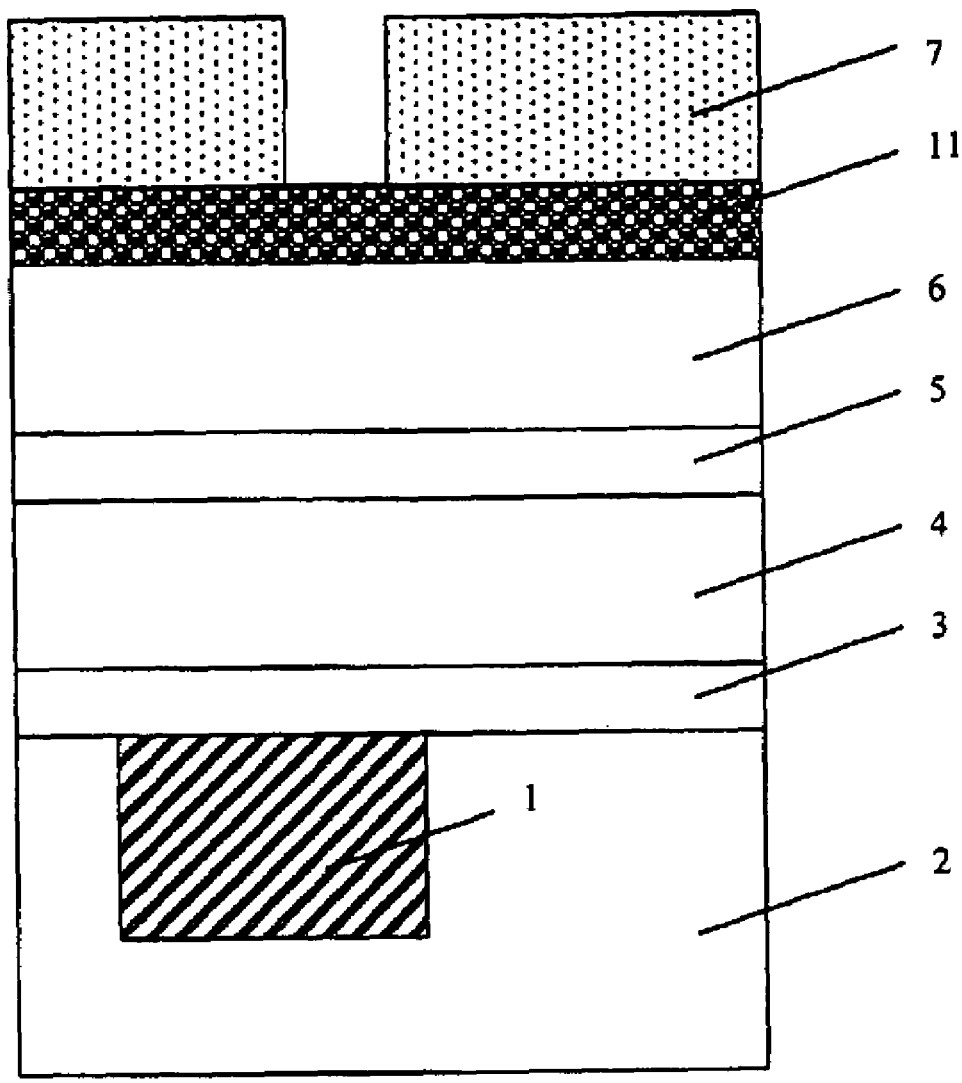
FIG. 2(a) shows the forming of a via photo layer over an ARC (antireflective coating) in a semiconductor device according to the conventional art.
Figure 2B:
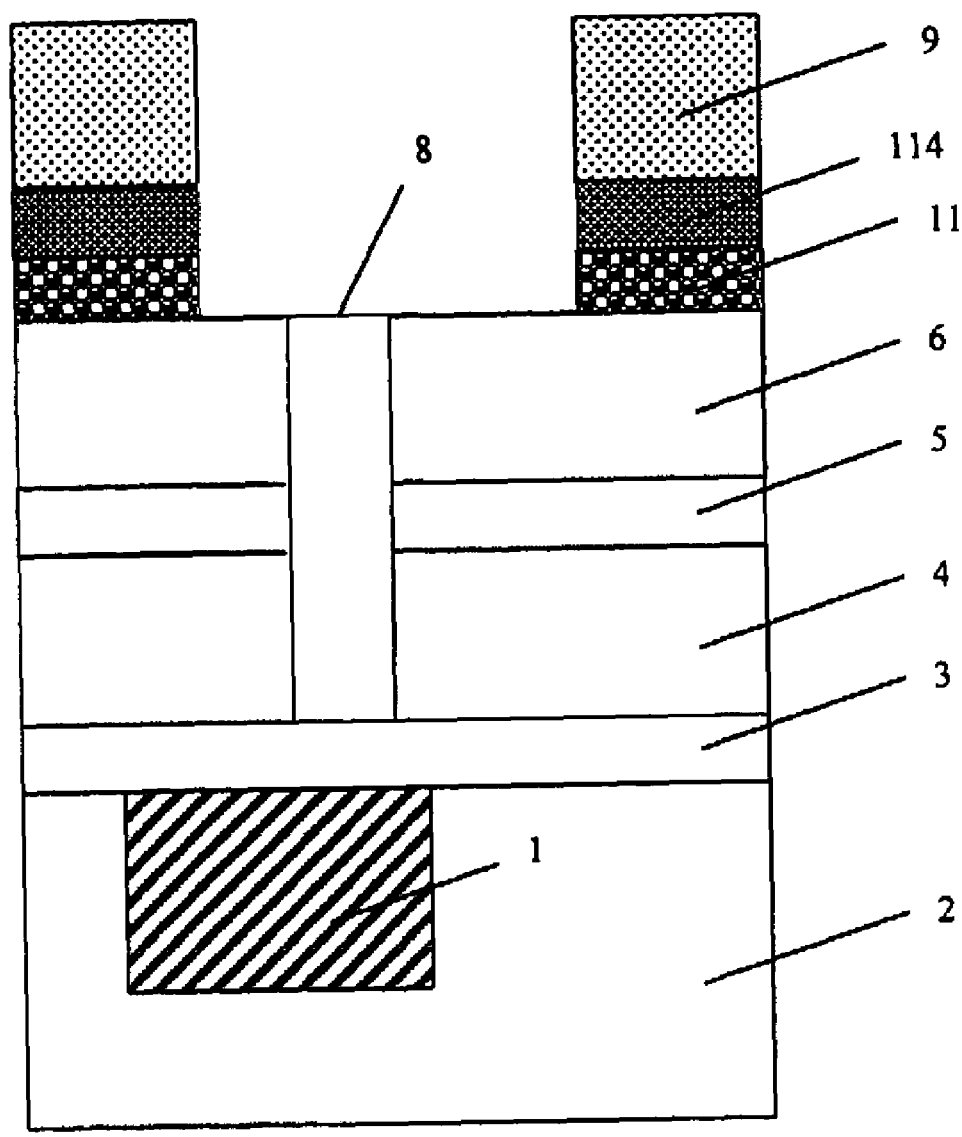
FIG. 2(b) shows the etching of the photoresist layer and the ARC in a semiconductor device according to the conventional art.
Figure 3:
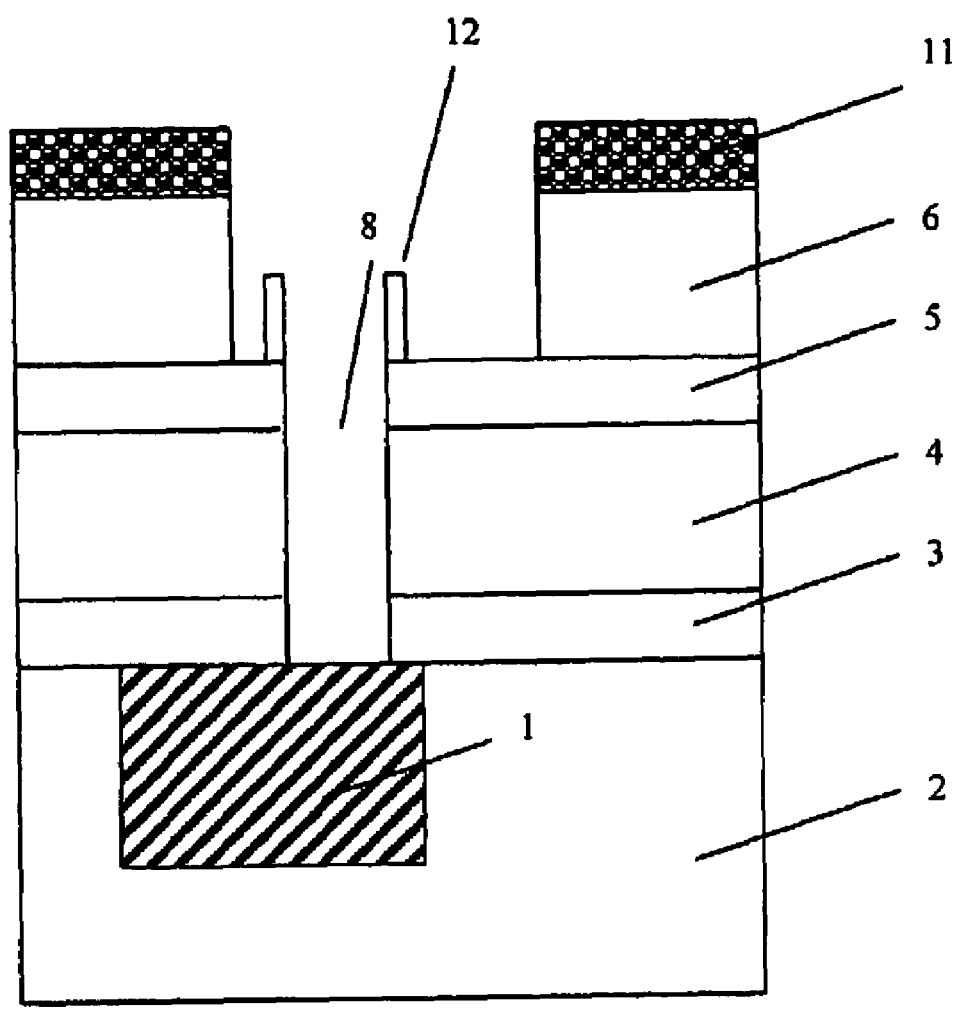
FIG. 3 show the disadvantageous forming of fencing structure around a via hole in a semiconductor device according to the conventional art.
Figure 4A:
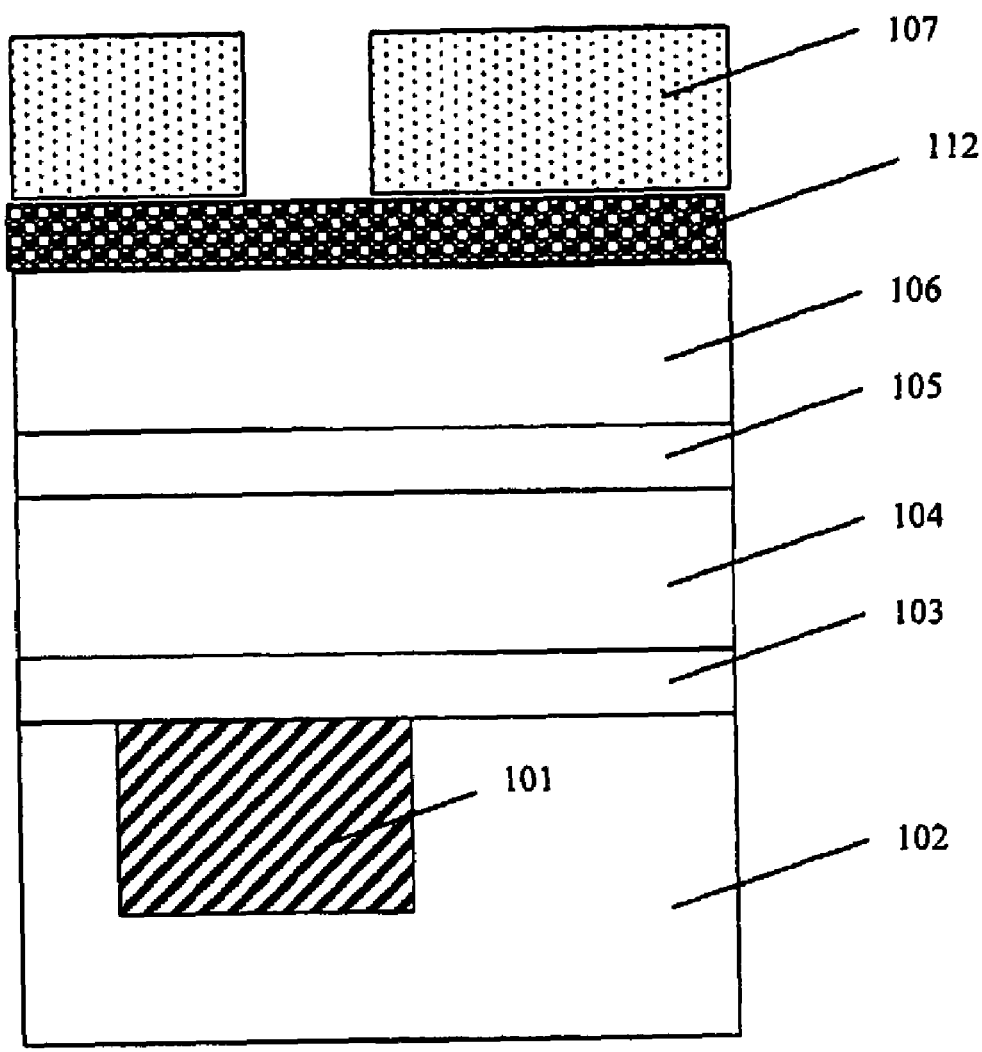
FIG. 4(a) shows a method of manufacturing a semiconductor device according to a preferred embodiment of the invention.

In a preferred embodiment for manufacturing a semiconductor shown in FIG. 4(a), a first stopper film 103, a first silicon oxide film 104, a second stopper film 105 and a second silicon oxide film 106 and an inorganic BARC layer 112 are successively formed over a layer insulation film 102 in which a wiring layer 101 is embedded. The wiring layer 101 can comprise copper, aluminum or an aluminum-copper alloy. The first wiring layers are formed on a substrate, not depicted in the drawings for the sake of brevity. The stopper films, 103, 105 can comprise silicon nitride ($Si_3N_4$) or silicon oxynitride, but they are not restricted to these materials. The wiring layer 101 can comprise aluminum or copper, but is preferably copper.

Figure 4B:
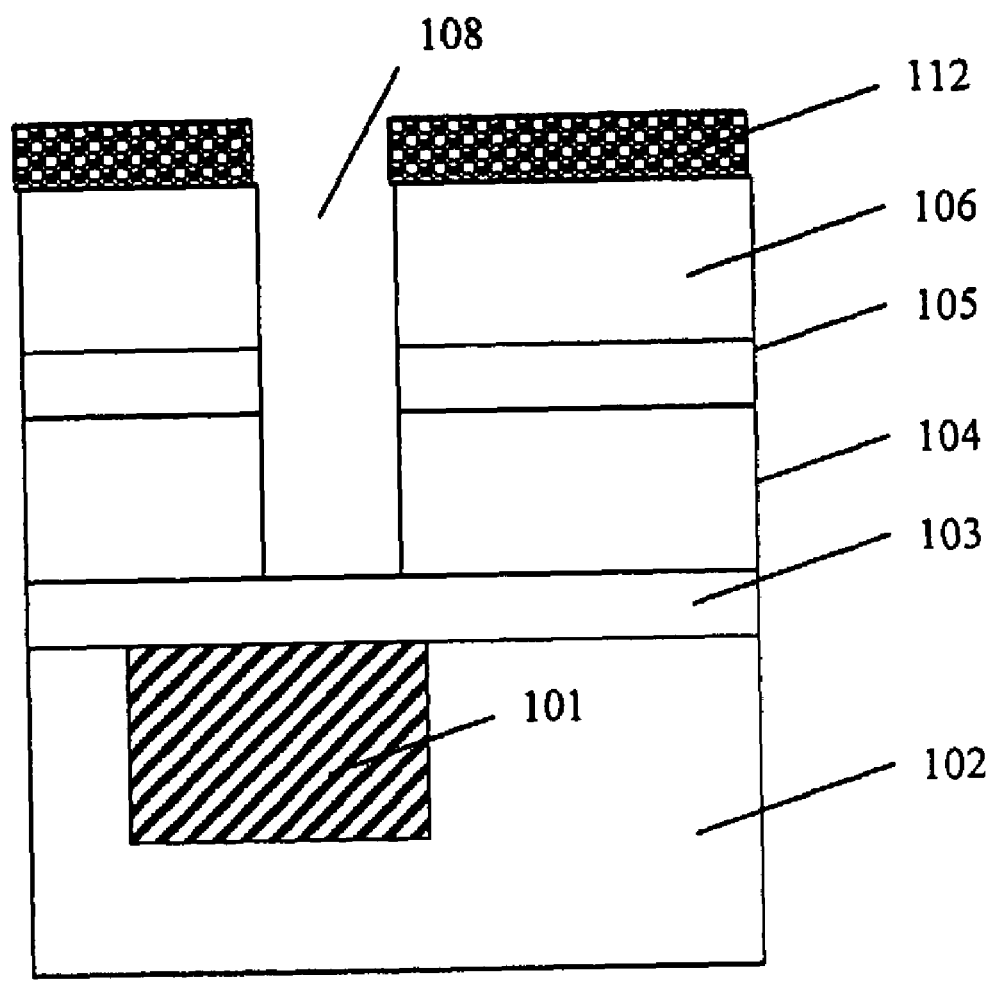
FIG. 4(b) shows the step of forming a via hole in a semiconductor device according to a preferred embodiment of the invention.

Next, as is shown in FIG. 4(b), anisotropic dry etching to open via hole 108 is performed using a first photoresist 107 as a mask. This etching is performed until the first stopper film 103 is exposed in the interior of via hole 108. The first stopper film 3 stops the progress of etching in this etching process.

When the etching to open via hole 108 is finished, the first photoresist 107 is removed from above the second silicon oxide film 106. Optionally, a second photoresist which has an open portion that corresponds to the wiring slot is formed (not shown).

Figure 4C:
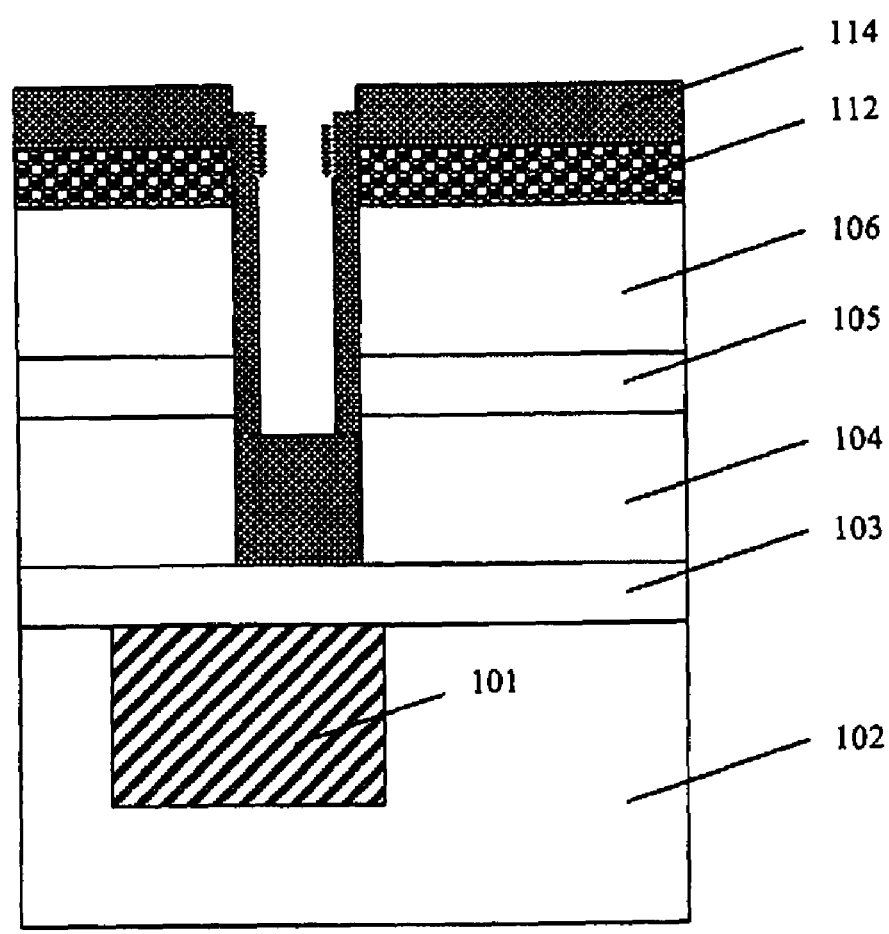
FIG. 4(c) shows the step of forming a BARC (bottom antireflective coating) according to a preferred embodiment of the conventional process.

FIG. 4(c) shows the application of BARC (bottom antireflective coating) films to the semiconductor device. Over the inorganic BARC layer 112 is formed an organic BARC layer 114.

The organic BARC layer 114 can comprise but is not restricted to polymeric materials such as PMMA (polymethyl methacrylate). Although polymethyl methacrylate (PMMA) can be used for the polymer film 114, any polymeric material or mixture that decomposes upon exposure to radiation can be used. These polymeric materials include polycarbonate, polyisobutylene, poly-α-methylstyrene, polyacrylate, polymethacrylate, polymethacrylamide, polyvinylidene chloride, cellulose, cellulosic polymers, polytetrafluoroethylene, tetrafluoroethylene or generally vinylidene type monomer polymers and copolymers The organic BARC layer 114 coats the entire internal surface of the via hole 108 to form a protective coating for the subsequent processing.

The organic BARC layer 114 can be applied by a suitable method such as by spin coating. The via hole 108 is filled with the organic BARC layer 114 to a level at or below the second stopper film 105 to a depth of about 4000 Å or less.

Spin coating is typically performed in four steps. The first step is the dispense step, where the material is dispensed onto the wafer while it is stationary or spinning very slowly. The second step is the spin-up, where the wafer is quickly accelerated to high rpm to spread the material over the entire wafer surface. The third step is spin-off, where excess material is thrown off to obtain a uniform coating on the wafer. The fourth step is solvent evaporation, where the wafer continues to spin at a constant rpm until the solvent evaporates. While spinning slowly may be only 100–200 rpm, a typical final spinning speed can be up to 4000 rpm.

Figure 4D:
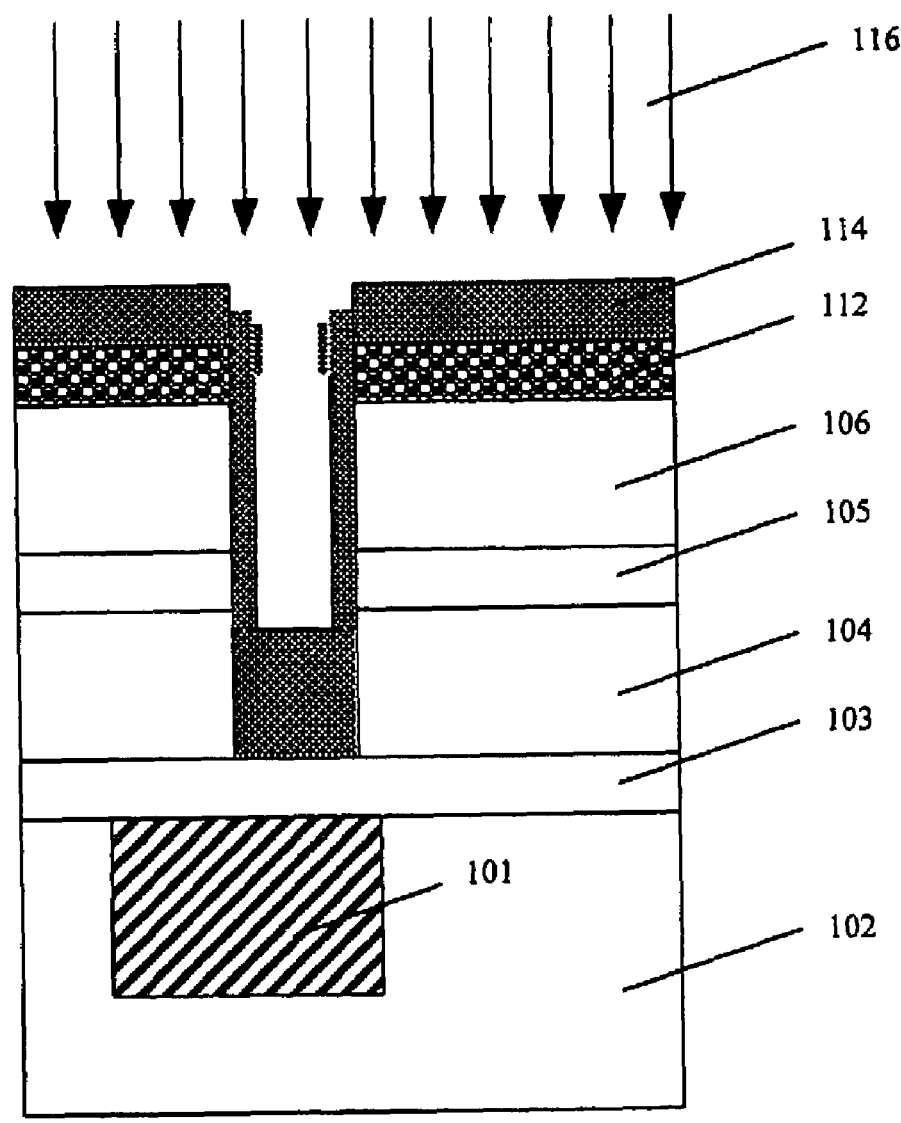
FIG. 4(d) shows the step of solvent treating the BARC according to a preferred embodiment of the invention.

Next, as is shown in FIG. 4(d) the organic BARC layer 114 attached to the walls of the via hole above the second stopper layer 105 is removed by applying a solvent. The solvent can be a dilute sulfuric acid solution or alternately a slightly alkaline solution. The solvent can also be an organic solvent such as EGMEA (ethyleneglycol monomethylether acetate) PGMEA (propyleneglycol, monomethylether acetate, cyclohexane, γ-butyrolactone, or other appropriate solvent. The wafer can be spun while the solvent is applied to the organic BARC layer 114. The solvent may be applied using the spin coating method described above. The solvent may be applied by spraying.

Figure 4E:
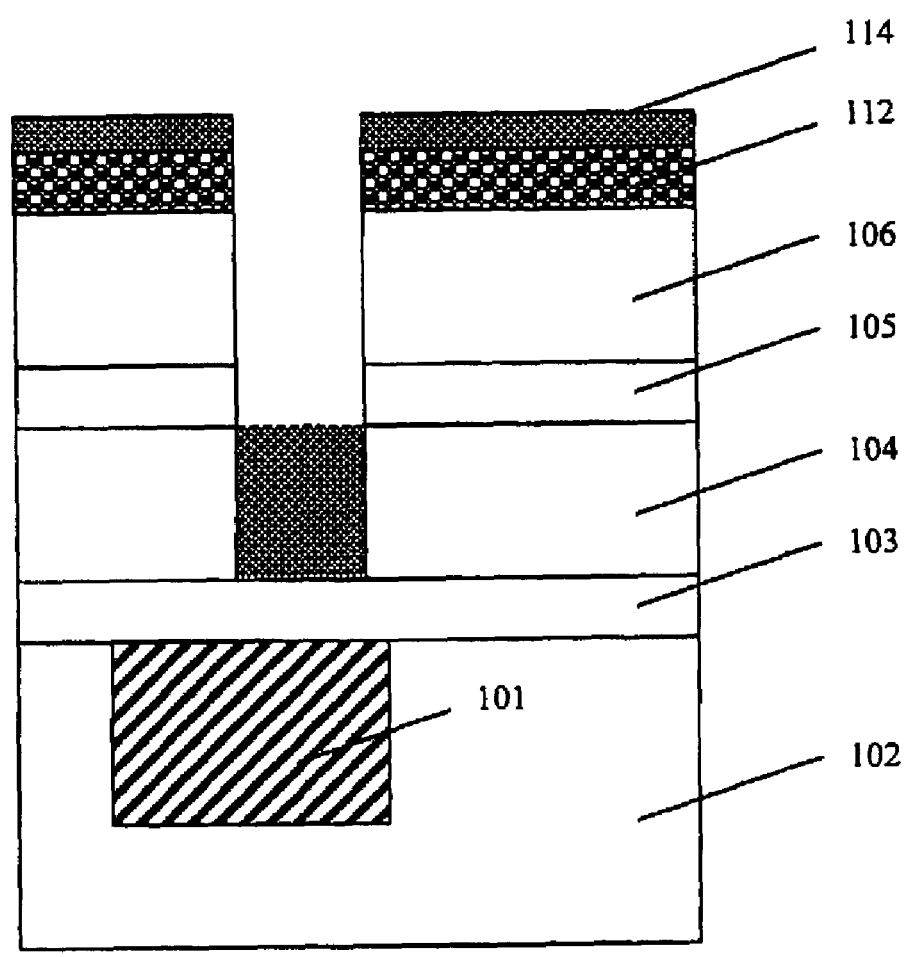
FIG. 4(e) shows a post-solvent treated semiconductor device according to a preferred embodiment of the invention.

FIG. 4(e) shows the results after the solvent treatment. A via hole 108 is formed having no observable fencing phenomena. The organic BARC layer 114 over the inorganic BARC layer 112 has been thinned by the solvent treatment. The via hole 108 is filled with the organic BARC layer 114 to a level at or below the second stopper film 105 to a depth of about 4000 Å or less.

Organic BARC has two advantages. One is a bottom antireflective coating film and the other one is a protection film for the first stopper film during the wiring slot etching.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. It is to be understood that the foregoing descriptions and specific embodiments shown herein are merely illustrative of the best mode of the invention and the principles thereof, which is therefore understood to be limited only by the scope of the appended claims.

What is claimed is:

1. A method for manufacturing a semiconductor device, which comprises:
    providing a layer insulation film in which a wiring layer is embedded;
    forming a first stopper film over the layer insulation film;
    forming a first dielectric film over the first stopper film;
    forming a second stopper film over the first dielectric film;
    forming a second dielectric film over the second stopper film;
    forming an inorganic BARC film over the second dielectric film;
    forming a via hole from the inorganic BARC film to the first stopper film;
    forming an organic BARC over the inorganic BARC covering an inside surface of the via hole; and
    treating the organic BARC with a solvent.

2. The method of claim 1, wherein the solvent is at least one solvent selected from the group consisting of a dilute sulfuric acid solution, a slightly alkaline solution, ethyleneglycol monomethylether acetate, propyleneglycol, monomethylether acetate, cyclohexane, and γ-butyrolactone.

3. The method of claim 1, wherein the organic BARC comprises PMMA.

4. The method of claim 1, wherein the inorganic BARC comprises silicon nitride or silicon oxynitride.

5. The method of claim 1, wherein the wiring layer comprises at least one of aluminum, copper or aluminum-copper alloy.

6. The method of claim 1, wherein the first dielectric and the second dielectric comprise silicon dioxide.

7. The method of claim 1, wherein the first stopper film and the second stopper film comprise silicon nitride.

* * * * *